United States Patent
Isoya

(10) Patent No.: US 12,156,373 B2
(45) Date of Patent: Nov. 26, 2024

(54) PIPE PROTECTION DEVICE AND COOLING DEVICE

(71) Applicant: NEC Platforms, Ltd., Kawasaki (JP)

(72) Inventor: Satoshi Isoya, Kanagawa (JP)

(73) Assignee: NEC Platforms, Ltd., Kanagawa (JP)

(*) Notice: Subject to any disclaimer, the term of this patent is extended or adjusted under 35 U.S.C. 154(b) by 603 days.

(21) Appl. No.: 17/427,779

(22) PCT Filed: Jan. 31, 2020

(86) PCT No.: PCT/JP2020/003772
§ 371 (c)(1),
(2) Date: Aug. 2, 2021

(87) PCT Pub. No.: WO2020/162367
PCT Pub. Date: Aug. 13, 2020

(65) Prior Publication Data
US 2022/0124944 A1  Apr. 21, 2022

(30) Foreign Application Priority Data

Feb. 5, 2019 (JP) ................. 2019-018963

(51) Int. Cl.
*H05K 7/20* (2006.01)
*F28F 9/02* (2006.01)
*F28F 9/26* (2006.01)

(52) U.S. Cl.
CPC ....... *H05K 7/20272* (2013.01); *F28F 9/0246* (2013.01); *F28F 9/26* (2013.01)

(58) Field of Classification Search
CPC ...... F28F 9/26; F28F 9/0246; H05K 7/20772; H05K 7/20272; G06F 1/20; G06F 1/182; G06F 2200/201
See application file for complete search history.

(56) References Cited

U.S. PATENT DOCUMENTS

2006/0065874 A1  3/2006 Campbell et al.
2007/0256957 A1* 11/2007 Herrmann .......... H05K 7/20645
206/710

(Continued)

FOREIGN PATENT DOCUMENTS

JP  H07-035453 A  2/1995
JP  H08-093969 A  4/1996

(Continued)

OTHER PUBLICATIONS

International Search Report for PCT Application No. PCT/JP2020/003772, mailed on Mar. 24, 2020.

(Continued)

*Primary Examiner* — Frantz F Jules
*Assistant Examiner* — Martha Tadesse

(57) ABSTRACT

A pipe protection device which is provided at a supply-side coupler provided at an end portion of a supply pipe which supplies a heat exchange medium to a heat exchange unit, and a discharge-side coupler provided at an end portion of a discharge pipe from which the heat exchange medium, which is supplied from the supply pipe to the heat exchange unit, is discharged, includes a supply-side support part having a recess along a contour of part of the supply pipe, a discharge-side support part having a recess along a contour of part of the discharge pipe, and a connecting part which supports the supply-side support part and the discharge-side support part at a predetermined interval and connects the supply-side support part and the discharge-side support part to a housing constituting a server.

7 Claims, 6 Drawing Sheets

(56) References Cited

U.S. PATENT DOCUMENTS

| | | |
|---|---|---|
| 2009/0219692 A1 | 9/2009 | Wavering et al. |
| 2013/0105116 A1 | 5/2013 | Campbell et al. |
| 2014/0085821 A1 | 3/2014 | Regimbal et al. |
| 2019/0008077 A1* | 1/2019 | Ishinabe ............ H05K 7/20736 |

FOREIGN PATENT DOCUMENTS

| | | |
|---|---|---|
| JP | 2006-183737 A | 7/2006 |
| JP | 2007-059561 A | 3/2007 |
| JP | 2007-300107 A | 11/2007 |
| JP | 2012-054498 A | 3/2012 |
| JP | 2013-038448 A | 2/2013 |
| JP | 2014-214821 A | 11/2014 |
| JP | 2015-501489 A | 1/2015 |
| JP | 2015-536049 A | 12/2015 |
| JP | 2019-012470 A | 1/2019 |
| WO | 2013/063250 A1 | 5/2013 |
| WO | 2015/020667 A1 | 2/2015 |

OTHER PUBLICATIONS

European Search Report for EP Application No. 20752168.3, dated on Sep. 28, 2022.

* cited by examiner

PIPE PROTECTION DEVICE AND COOLING DEVICE

This application is a National Stage Entry of PCT/JP2020/003772 filed on Jan. 31, 2020, which claims priority from Japanese Patent Application 2019-018963 filed on Feb. 5, 2019, the contents of all of which are incorporated herein by reference, in their entirety.

TECHNICAL FIELD

The present invention relates to a pipe protection device and a cooling device

BACKGROUND ART

There is a cooling method in which electronic devices accommodated in a server rack are cooled by a heat exchange medium such as water. In this water cooling method, a hose for supplying and discharging cooling water to a cooling unit is used on a back surface thereof.

That is, a cooling unit in which a supply pipe and a discharge pipe are connected to a tank-shaped component which is in contact with a heat generating part or the like is used.

As techniques related to the cooling unit, there are those described in Patent Literatures 1, 2, 3, and 4.

CITATION LIST

Patent Literature

[Patent Literature 1]
Japanese Unexamined Patent Application, First Publication No. H07-35453
[Patent Literature 2]
Japanese Unexamined Patent Application, First Publication No. 2007-300107
[Patent Literature 3]
Japanese Unexamined Patent Application, First Publication No. 2012-54498
[Patent Literature 4]
Published Japanese Translation No. 2015-501489 of the PCT International Publication

SUMMARY OF THE INVENTION

Problems to be Solved by the Invention

Incidentally, in a server using a cooling unit, a method in which a plurality of servers is accommodated in a rack in a multi-stage manner is adopted. In such a method, it is necessary to connect a large number of supply pipes (hoses) and discharge pipes (hoses) which are pulled out from the back of the server in each stage, to collecting pipes on the supply side and the discharge side.

In this case, it is difficult to directly visually check the supply pipes and the discharge pipes on the back surface side when the server is pulled out or inserted. For this reason, it requires close attention to perform the pulling-out and the insertion work while preventing damage caused by the large number of hoses getting entangled, a coupler (a connector which connects a pipe detachably) at a tip end of a hose being caught or pressed by other members, or the like.

An example of object of the present invention is to prevent entanglement of a supply pipe and a discharge pipe of a cooling unit used for cooling an electronic device, excessive pulling-out thereof, or damage to a coupler thereof.

Means for Solving the Problems

In order to solve the above problems, the present invention proposes the following means. A pipe protection device according to a first aspect of the present invention is a pipe protection device which is provided at a supply-side coupler provided at an end portion of a supply pipe which supplies a heat exchange medium to a heat exchange unit, and a discharge-side coupler provided at an end portion of a discharge pipe from which the heat exchange medium, which is supplied from the supply pipe to the heat exchange unit, is discharged, including a supply-side support part having a recess along a contour of part of the supply pipe, a discharge-side support part having a recess along a contour of part of the discharge pipe, and a connecting part which supports the supply-side support part and the discharge-side support part at a predetermined interval and connects the supply-side support part and the discharge-side support part to a housing constituting a server.

Advantageous Effects of Invention

According to the present invention, damage due to interference with other members or the like can be prevented by supporting the pipe and the coupler used for connecting the pipe at a predetermined position.

EXAMPLE EMBODIMENT

Figure 1:
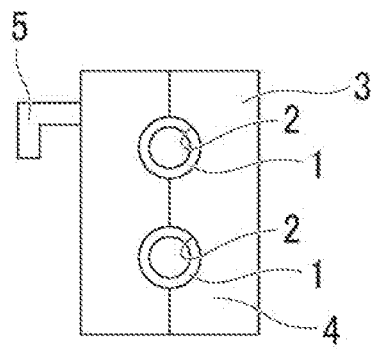
FIG. 1 is a diagram showing a minimum configuration of a pipe protection device according to the present invention.

A minimum configuration of a pipe protection device according to the present embodiment will be described with reference to FIG. 1. The reference numeral 1 represents couplers, and one of upper and lower couplers 1 is provided at a tip end of a supply pipe and is connected to a collecting pipe (not shown) on the supply side of a heat medium, for example, as part of the supply pipe which supplies the heat medium to a tank-shaped cooling unit (not shown) having a predetermined volume. The other one of the two couplers 1 is connected to a collecting pipe (not shown) on the recovery side of the heat medium provided at a tip end of a discharge pipe, for example, as part of the discharge pipe which discharges the heat medium in which heat is exchanged by the cooling unit.

One of the couplers 1 is supported by a supply-side support part 3 having a recess 2 along the contour of the coupler 1, and the other one of the couplers 1 is also supported by a discharge-side support part 4 having a recess 2 along the contour of the coupler 1. The supply-side support part 3 and the discharge-side support part 4 are integrally formed to support the two couplers 1 in a predetermined positional relationship. In the shown example, in the supply-side support part 3 and the discharge-side support part 4 which are integrally formed, an upper part is referred to as the supply-side support part 3 and the lower part is referred to as the discharge-side support part 4.

Further, the supply-side support part 3 and the discharge-side support part 4 are mounted in a housing (not shown) of an electronic device such as a server by a connecting part 5 integrally provided therein.

In the pipe protection device having the above-described configuration, the two couplers 1 can be accommodated in the supply-side support part 3 and the discharge-side support part 4 in a state in which they are fitted in the recesses 2 and can be fixed in a constant positional relationship. Further, because they are connected to the housing in a state in which they are supported by the supply-side support part 3 and the discharge-side support part 4, a position of a pipe having the coupler 1 can be stabilized. Therefore, for example, when the housing is inserted into or removed from a rack, the coupler or the pipe located at the back side of the housing is prevented from being caught in the rack or the housing or being crushed and damaged.

The respective couplers 1 are generally mounted on a piping material such as a hose. Therefore, the recesses 2 of the supply-side support part 3 and the discharge-side support part 4 include one which accommodates not only the coupler 1 but also part of the piping material mounted thereon.

Figure 2:
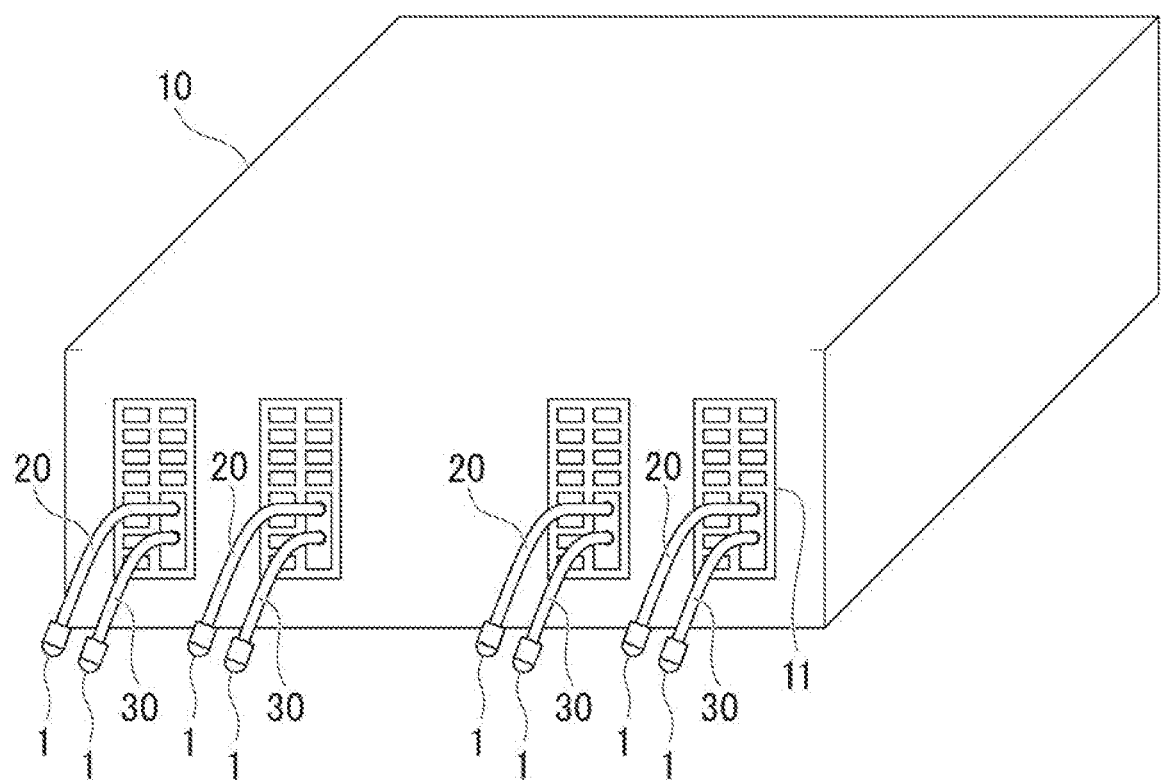
FIG. 2 is a perspective view showing a server equipped with a protection device according to a first embodiment of the present invention.

The first embodiment of the present invention will be described with reference to FIGS. 2 to 6. In FIGS. 2 to 6, the same components as those in FIG. 1 are designated by the same reference numerals, and the description thereof is simplified. FIG. 2 is a perspective view showing a server equipped with the protection device according to the first embodiment.

The reference numeral 10 represents a server (for convenience, an exterior of the housing which accommodates the server is shown), and an electronic device such as a circuit board is accommodated in the server 10. Further, a cooling unit (not shown) which accommodates a heat medium for absorbing heat is provided in a heat generating component mounted in the electronic device, for example, a semiconductor device. The reference numeral 20 in FIG. 2 represents a supply pipe for supplying the heat medium to the cooling unit, and the supply pipe 20 is formed of, for example, rubber and is flexibly formed. Further, the reference numeral 30 represents a discharge pipe for discharging the heat medium from the cooling unit, and the discharge pipe 30 is formed of, for example, rubber, like the supply pipe 20, and is flexibly formed.

The supply pipe 20 and the discharge pipe 30 are pulled out from an opening part 11 on a back surface of the server 10, as shown in FIG. 2. In the shown example, four cooling units are built in the server 10, and the supply pipe 20 and the discharge pipe 30 are connected in parallel to each of the cooling units. The couplers 1 are mounted on the respective tip ends of each of the supply pipe 20 and the discharge pipe 30 to detachably connect the tip ends to other pipes such as a supply-side collecting pipe (not shown) which is a supply source of the heat medium and a recovery-side collecting pipe (not shown) which is a recovery source.

Figure 3A:
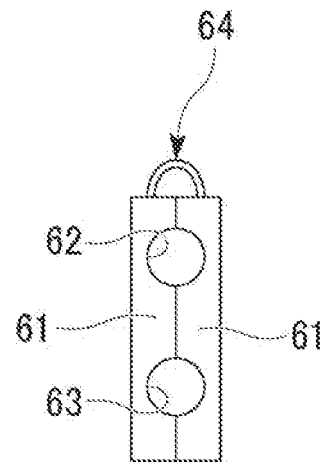
FIG. 3A is a front view of the protection device of the first embodiment.
Figure 3B:
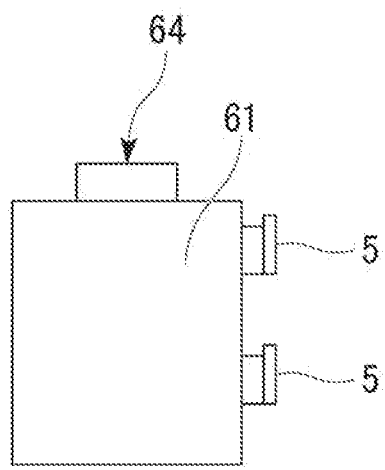
FIG. 3B is a side view of the protection device of the first embodiment.

FIGS. 3A and 3B are a front view and a side view of the protection device of the first embodiment. The protection device, which accommodates and protects the supply pipe 20, the discharge pipe 30, and the coupler 1, has an exterior as shown in the front view of FIG. 3A or the side view of FIG. 3B as a whole.

That is, the protection device has two cap pieces 61 which are combined in a state in which they face each other, and each of the cap pieces 61 has a recess 62 as a supply-side support part and a recess 63 as a discharge-side support part. Further, the two cap pieces 61 are connected to each other by an elastically deformable connecting plate 64.

Figure 4A:
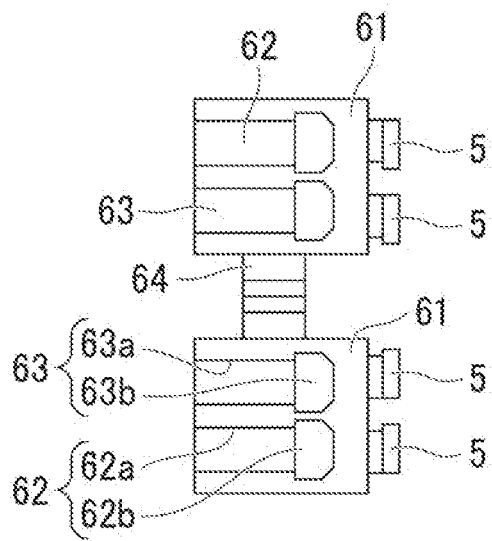
FIG. 4A is a side view of an open state of the protection device of the first embodiment.
Figure 4B:
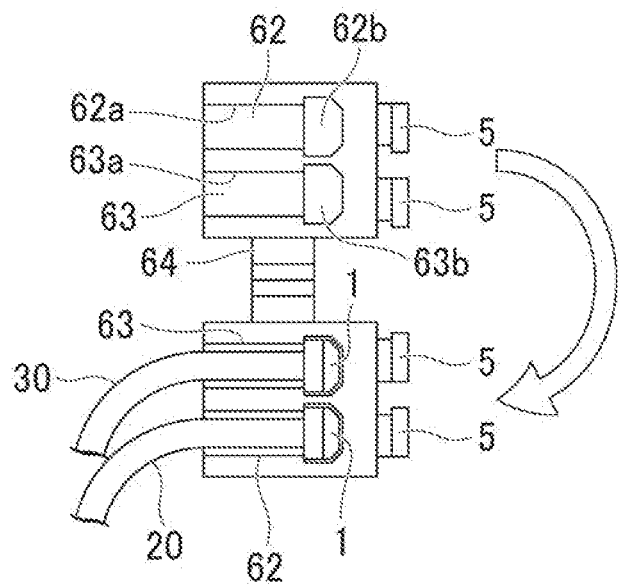
FIG. 4B is a side view of a set state of the protection device of the first embodiment.
Figure 4C:
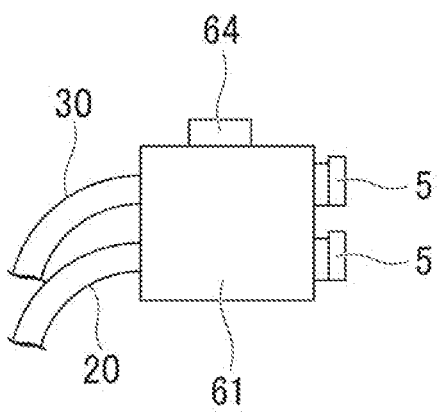
FIG. 4C is a side view of a closed state of the protection device of the first embodiment.

FIGS. 4A to 4C are side views of an open state, a set state, and a closed state of the protection device of the first embodiment. More specifically, as shown in FIG. 4A, two cap pieces 61 are disposed line-symmetrically, and a configuration in which the two cap pieces 61 are connected by the thin plate-shaped connecting plate 64 is adopted. FIG. 4A shows a state in which joining surfaces of the two cap pieces 61 are developed to be arranged on the same plane, and the connecting plate 64 extends in a plane shape between the two cap pieces 61. Further, the connecting plate 64 has a streak shape in a left and right direction of FIG. 4A, and irregularities are repeatedly formed in a vertical direction of the drawing. Therefore, the connecting plate 64 is molded so that bending deformation is easily achieved when the cap pieces 61 face each other.

The recess 62 has a hose accommodating part 62a in which a hose is accommodated as a supply pipe, and a coupler accommodating part 62b in which the coupler 1 at the tip end of the hose is accommodated. Further, the recess 63 has a hose accommodating part 63a in which a hose is accommodated as a discharge pipe and a coupler accommodating part 63b in which the coupler 1 at the tip end of the hose is accommodated. Here, as a clearance (a gap) between the recesses 62 and 63, the supply pipe 20, the discharge pipe 30, and an exterior (a contour) of the coupler 1 is set to be larger, operability when mounting and removal is improved. Further, as the clearance (the gap) is set smaller, the cap piece 61 can be held stably without rattling when the cap pieces 61 are integrally held.

The two cap pieces 61 in which the recesses 62 and 63 are formed and the connecting plate 64 which connects the two cap pieces 61 can be manufactured, for example, by integrally molding soft plastic, rubber, or a mixture thereof.

Figure 5:
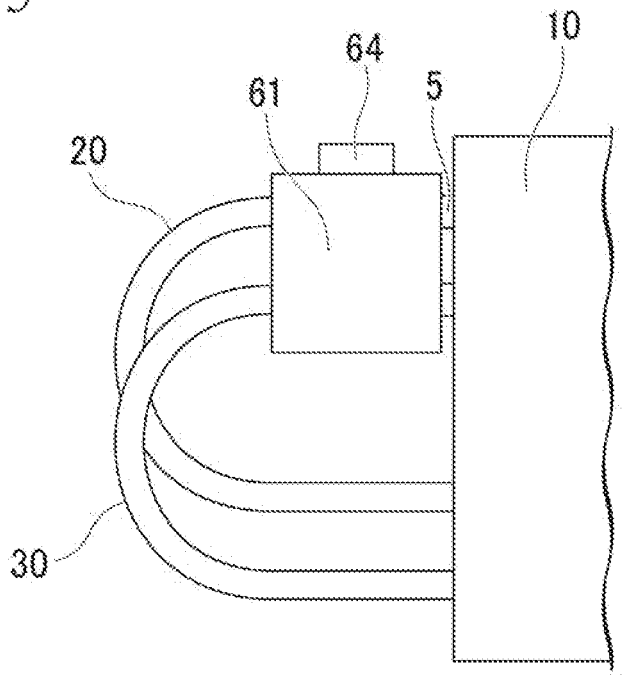
FIG. 5 is a side view showing a state in which the protection device of the first embodiment is mounted in a rack.
Figure 6:
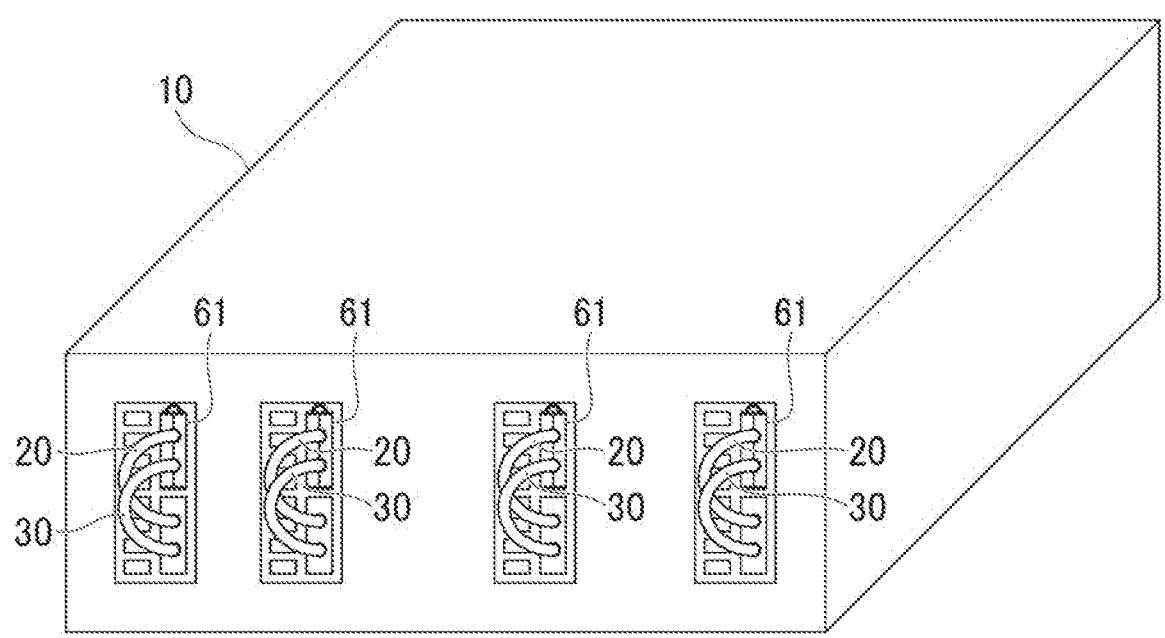
FIG. 6 is a perspective view of a server equipped with the protection device of the first embodiment when seen from the rear surface side.

With reference to FIGS. 4A to 4C, an assembling process of the protection device having the above-described configuration and an operation thereof will be described. FIG. 5 is a side view showing a state in which the protection device of the first embodiment is mounted on the rack. FIG. 6 is a perspective view of the server equipped with the protection device of the first embodiment when seen from the rear surface side.

As shown in FIG. 4A, the cap pieces 61 and 61 of the protection device are prepared in an unfolded state. Here, the two recesses 62 and 63 are positioned parallel to each other.

As shown in FIG. 4B, the supply pipe 20, the discharge pipe 30, and the couplers 1 at the tip ends of the supply pipe 20 and the discharge pipe 30 are fitted and accommodated in the recesses 62 and 63 of one of the cap pieces 61 (on the lower side in the shown example). At this time, since the recesses 62 and 63 are formed in a half-split shape, the supply pipe 20, the discharge pipe 30, and lower half portions of the couplers 1 are accommodated in the recesses 62 and 63 of one of the cap pieces 61 (on the lower side in the shown example). Specifically, the supply pipe 20 is accommodated in the hose accommodating part 62a, and the coupler 1 is accommodated in the coupler accommodating part 62b. Further, the discharge pipe 30 is accommodated in the hose accommodating part 63a, and the coupler 1 is accommodated in the coupler accommodating part 63b.

As shown by an arrow in FIG. 4B, the upper cap piece 61 overlaps the lower cap piece 61 while the connecting plate 64 is bent. Then, as shown in FIG. 4C, the recesses 62 and 63 of the upper cap piece 61 and the recesses 62 and 63 of the lower cap piece 61 overlap each other in a state in which they face each other. As a result, the recesses 62 and 63 become an integral space, and the supply pipe 20, the discharge pipe 30, and the couplers 1 at the tip end thereof are accommodated in this space.

The two cap pieces 61 can be kept closed by engaging the connecting parts 5 with each other in this state, or by wrapping a rubber belt or the like therearound and also using a fixing means such as bolt tightening.

In the state of FIG. 4C, the supply pipe 20, the discharge pipe 30, and the couplers 1 at the tip ends thereof are accommodated between the two cap pieces 61 and 61. Therefore, the whole of the protection device is protected, and it is less likely to be damaged by interference with peripheral devices in a region in which wires and devices are crowded, such as the back surface side of the server. Further, as shown in FIGS. 5 and 6, the hoses constituting the supply pipe 20 and the discharge pipe 30 can be disposed at predetermined positions in an orderly manner by hooking the connecting part 5 on part of the housing 10.

In this way, the supply pipe 20 and the discharge pipe 30 are put in and out of the rack in a state in which they are collectively supported by a rear portion of the housing 10 using the protection device of the first embodiment. Then, after the mounting or removal (insertion or withdrawal) of the housing 10 is completed, the cap piece 61 is opened, and the supply pipe 20, the discharge pipe 30, and the couplers 1 are taken out from the recesses 62 and 63 and are connected to predetermined pipes to supply or recover the heat medium. Thus, the electronic components and the like in the server 10 can be cooled.

Figure 7:
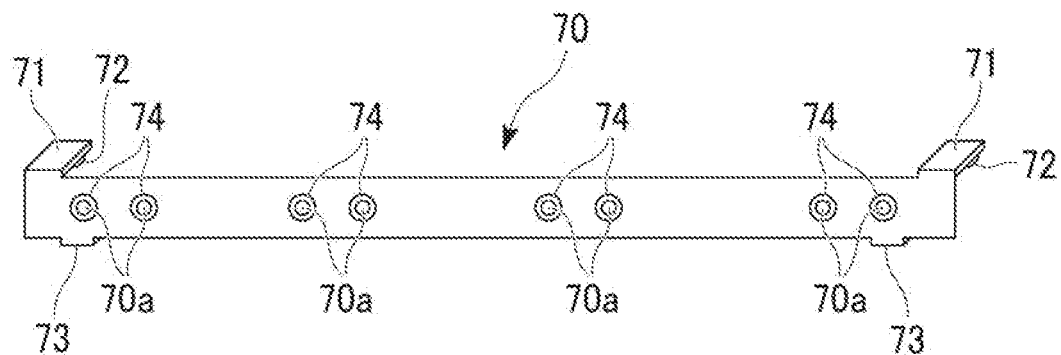
FIG. 7 is a perspective view of a protection device according to a second embodiment of the present invention.
Figure 8:
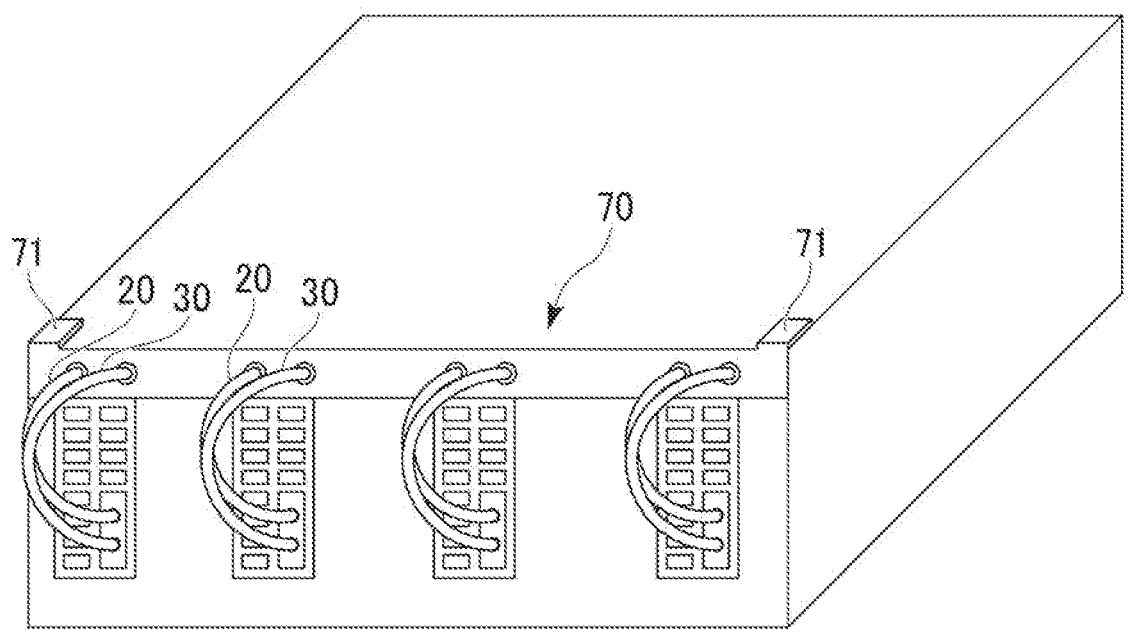
FIG. 8 is a perspective view of a server equipped with the protection device of the second embodiment when seen from the rear surface side.
Figure 9:
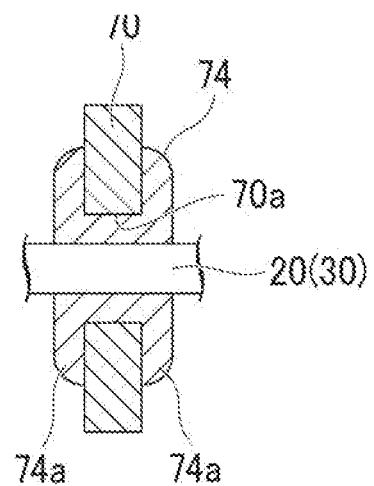
FIG. 9 is a longitudinal cross-sectional view of the protection device of the second embodiment.

FIGS. 7 to 9 show a second embodiment. In FIGS. 7 to 9, the same components as those in FIGS. 1 to 6 are designated by the same reference numerals, and the description thereof is simplified. FIG. 7 is a perspective view of the protection device according to the second embodiment. FIG. 8 is a perspective view of the server equipped with the protection device of the second embodiment when seen from the rear surface side.

The reference numeral 70 in FIGS. 7 to 9 represents a connecting part mounted on the back surface of the server 10 as shown in FIG. 8. The connecting part 70 has a plate shape as a whole and has protrusions 71 which protrude in forward and rearward directions (in a depth direction of the server 10) at both ends on the upper side (the upper surface side of the server 10), for example, by bending part of a sheet metal. A leaf spring 72 having a structure in which a thin plate-shaped spring steel is formed in a curved shape is provided on a lower surface of each of the protrusions 71. The leaf spring 72 is mounted on the lower surface of the protrusion 71 so that it can be elastically deformed in a thickness direction of the protrusion 71.

Further, claw parts 73 which protrude in the forward and rearward directions (in the depth direction of the server 10) are formed at both ends of the connecting part 70 on the lower side (the lower surface side of the server 10), for example, by bending part of the sheet metal. The claw part 73 is formed to be hooked on part of the housing constituting the server 10.

That is, the connecting part 70 is mounted on the back surface of the server 10 by elastically deforming the leaf spring 72 in a state in which the claw part 73 is hooked.

FIG. 9 is a longitudinal cross-sectional view of the protection device of the second embodiment. As shown in FIG. 9, a through hole 70a is formed in the connecting part 70, and a grommet 74 formed of an elastic body such as rubber is mounted in the through hole 70a. The grommet 74 is removably mounted in the support part 70 by sandwiching the sheet metal around the through hole 70a therebetween with flange parts 74a. Further, the grommet 74 fixes the supply pipe 20 or the discharge pipe 30 to the connecting part 70 by being elastically deformed around the hose constituting the supply pipe 20 or the discharge pipe 30.

In this way, the supply pipe 20 and the discharge pipe 30 are fixed to the connecting part 70 by the grommet 74. Therefore, the connecting part 70 also has a function of connecting the supply pipe 20 and the discharge pipe 30, or the couplers (not shown in FIGS. 7 to 9) integrated with the supply pipe 20 and the discharge pipe 30 to the housing 10 while a predetermined arrangement relationship is maintained.

In the second embodiment, the supply pipe 20 and the discharge pipe 30 are supported by the connecting part 70. As a result, as shown in FIG. 8, the hoses constituting the supply pipe 20 or the discharge pipe 30 can be mounted in an orderly manner at predetermined positions on the back surface of the server 10.

The length, the diameter and the number of the supply pipes and discharge pipes, and the diameter, the structure, and the number of the couplers may be appropriately changed according to specifications of the pipe material and accessories used in the piping system in which the heat medium circulates.

Although embodiments of the present invention have been described in detail with reference to the drawings, the specific configuration is not limited to these embodiments, and design changes and the like within a range not deviating from the gist of the present invention are also included.

This application claims priority on the basis of Japanese Patent Application No. 2019-18963 filed in Japan on Feb. 5, 2019, the entire disclosure of which is incorporated herein.

INDUSTRIAL APPLICABILITY

The present invention can be used for electronic devices such as servers and the like which require supply and discharge of a cooling medium to a cooling unit that cools heat-generating components.

REFERENCE SIGNS LIST

1 Coupler
2 Recess
3 Supply-side support part
4 Discharge-side support part

5 Connecting part
10 Server (housing)
11 Opening part
20 Supply pipe
30 Discharge pipe
61 Cap piece
62 Recess (supply-side support part)
62a Hose accommodating part
62b Coupler accommodating part
63 Recess (discharge-side support part)
63a Hose accommodating part
63b Coupler accommodating part
64 Connecting plate
70 Connecting part
70a Through hole
71 Protrusion
72 Leaf spring
73 Claw part
74 Grommet
74a Flange part

What is claimed is:

1. A pipe protection device provided at a supply-side coupler and at a discharge-side coupler, the supply-side coupler provided at an end portion of a supply pipe which supplies a heat exchange medium to a heat exchange unit, the discharge-side coupler provided at an end portion of a discharge pipe from which the heat exchange medium supplied from the supply pipe to the heat exchange unit is discharged, the pipe protection device comprising:
a supply-side support part having a recess along a contour of part of the supply pipe, the supply-side support part comprising a first supply-side support part half-split along part of a contour of the supply-side coupler and a second supply-side support part half-split along another part of the contour of the supply-side coupler;
a discharge-side support part having a recess along a contour of part of the discharge pipe, the discharge-side support part comprising a first discharge-side support half-split along part of a contour of the discharge-side coupler and a second discharge-side support half-split along another part of the contour of the discharge-side coupler;
a connecting plate that is elastically deformable and connects a first support member to a second support member in a state in which parallel arrangement is made such that the first supply-side support part and the first discharge-side support are disposed parallel to each other in the first support member, and such that the second supply-side support part and the second discharge-side support are disposed parallel to each other in the second support member; and
a connecting part that supports the supply-side support part and the discharge-side support part at a predetermined interval and connects the supply-side support part and the discharge-side support part to a housing constituting a server.

2. The pipe protection device according to claim 1, wherein the first support member and the second support member are further connected to each other by the connecting plate disposed between the first support member and the second support member in a state in which the first and second supply-side support parts and the first and second discharge-side support parts open in a same direction.

3. The pipe protection device according to claim 2, wherein the first supply-side support part of the first support member and the second supply-side support part of the second support member are combined in a state in which opening parts of the first and second supply-side support parts face each other.

4. The pipe protection device according to claim 1, wherein the supply-side support part and the discharge-side support part are elastic bodies configured to pass through the connecting part and that are disposed around the supply pipe and the discharge pipe.

5. The pipe protection device according to claim 1, wherein the supply-side support part and the discharge-side support part are respectively penetrated by the supply pipe and the discharge pipe as elastically deformable hollow members provided in the connecting part.

6. A cooling device comprising:
a pipe protection device provided at a supply-side coupler and at a discharge-side coupler, the supply-side coupler provided at an end portion of a supply pipe which supplies a heat exchange medium to a heat exchange unit, the discharge-side coupler provided at an end portion of a discharge pipe from which the heat exchange medium supplied from the supply pipe to the heat exchange unit is discharged, the pipe protection device including:
a supply-side support part having a recess along a contour of part of the supply pipe, the supply-side support part comprising a first supply-side support part half-split along part of a contour of the supply-side coupler and a second supply-side support part half-split along another part of the contour of the supply-side coupler;
a discharge-side support part having a recess along a contour of part of the discharge pipe, the discharge-side support part comprising a first discharge-side support half-split along part of a contour of the discharge-side coupler and a second discharge-side support half-split along another part of the contour of the discharge-side coupler;
a connecting plate that is elastically deformable and connects a first support member to a second support member in a state in which parallel arrangement is made such that the first supply-side support part and the first discharge-side support are disposed parallel to each other in the first support member, and such that the second supply-side support part and the second discharge-side support are disposed parallel to each other in the second support member; and
a connecting part that supports the supply-side support part and the discharge-side support part at a predetermined interval and connects the supply-side support part and the discharge-side support part to a housing constituting a server;
an accommodating part which the receives supply of the heat exchange medium from the supply pipe;
the supply-side coupler provided at the end portion of the supply pipe;
the discharge pipe through which the heat exchange medium is discharged from the accommodating part; and
the discharge-side coupler provided at the end portion of the discharge pipe.

7. The pipe protection device according to claim 1, wherein the connecting plate extends in a plane shape between the first support member and the second support member, and is formed as a plate.

* * * * *